United States Patent [19]
Cooperman

[11] Patent Number: 5,204,982
[45] Date of Patent: Apr. 20, 1993

[54] METHOD AND APPARATUS FOR DIGITAL SWITCHING OF FM SIGNALS WITH REDUCED CROSSTALK

[75] Inventor: Michael Cooperman, Framingham, Mass.

[73] Assignee: GTE Laboratories Incorporated, Waltham, Mass.

[21] Appl. No.: 613,177

[22] Filed: Nov. 14, 1990

[51] Int. Cl.$^5$ ................... H04B 1/10; H03K 17/687
[52] U.S. Cl. ..................... 455/295; 455/296; 307/572; 307/585
[58] Field of Search ............... 307/520, 572, 542, 585, 307/443; 328/167, 162, 163; 455/295, 296; 330/149

[56] References Cited

U.S. PATENT DOCUMENTS

| | | | |
|---|---|---|---|
| 4,622,480 | 11/1986 | Uchimura et al. | 307/520 |
| 4,752,703 | 6/1987 | Lin | 307/572 |
| 4,810,912 | 11/1987 | Theus et al. | 307/585 |
| 4,947,177 | 8/1990 | Fothergill | 328/167 |

FOREIGN PATENT DOCUMENTS 1276741  6/1972  United Kingdom .

OTHER PUBLICATIONS

Hyun, J. Shin, et al, "250-Mbit/s CMOS Crosspoint Switch"; I.E.E.E. Journal of Solid-State Circuits; Apr. 1989; pp. 478–486.

Primary Examiner—Reinhard J. Eisenzopf
Assistant Examiner—Nguyen Vo
Attorney, Agent, or Firm—Lawrence E. Monks; Victor F. Lohmann, III

[57] ABSTRACT

Apparatus for digital switching of FM signals includes multiple functional switching circuits, each having an input for receiving an FM signal at a first frequency and each generating first switching transients in response to the FM signal. The apparatus includes a dummy switching circuit corresponding to each functional switching circuit. The dummy switching circuits generate second switching transients in response to the FM signal. The second switching transients are shifted in phase relative to the first switching transients such that a crosstalk signal resulting from the first and second switching transients has a frequency of twice the first frequency. The apparatus further includes filters for attenuating the crosstalk signal. By shifting the frequency of the crosstalk signal to twice the frequency of the FM signal, the crosstalk signal is easily filtered.

14 Claims, 3 Drawing Sheets

METHOD AND APPARATUS FOR DIGITAL SWITCHING OF FM SIGNALS WITH REDUCED CROSSTALK

FIELD OF THE INVENTION

This invention relates to digital switching apparatus including multiple digital switching circuits and, more particularly, to methods and apparatus for reducing crosstalk between the switching circuits. The invention is particularly useful in reducing crosstalk in digital switching apparatus which receives FM input signals.

BACKGROUND OF THE INVENTION

A digital switch, as used in telecommunication systems, consists of a plurality of digital switching circuits in an integrated circuit. Signals applied to the inputs of the digital switch are routed to selected outputs in response to control signals.

Digital switches can be used to switch frequency modulated (FM) video information. An analog FM signal is applied directly to an input of the digital switch. Since the switching path within the digital switch includes multiple cascaded digital gates, the analog FM signal is clipped on the positive and negative peaks of the sine wave signal. The output of the switch is a square wave signal having a period which varies in accordance with the input analog FM signal. After filtering of the digital switch output, the analog FM input signal is reproduced.

When multiple FM signals are applied to the inputs of the digital switch, crosstalk results from capacitive coupling between inputs and outputs and from inductive coupling between outputs. The inductive coupling between outputs is caused by stray inductance in the supply voltage and ground lines and can contribute over 90% of the total crosstalk. Reduction of crosstalk caused by inductive coupling would produce a major improvement in FM switching.

It is a general object of the present invention to provide improved methods and apparatus for digital switching.

It is another object of the present invention to reduce crosstalk in digital switching apparatus.

It is a further object of the present invention to provide improved methods and apparatus for digital switching of FM signals.

It is yet another object of the present invention to provide circuits for crosstalk reduction which are simple in construction and low in cost.

SUMMARY OF THE INVENTION

According to the present invention, these and other objects and advantages are achieved in methods and apparatus for digital switching. The apparatus comprises a plurality of functional switching circuits, each having an input for receiving an FM signal at a first frequency and each generating first switching transients in response to the FM signal, means for generating second switching transients in response to the FM signal, the second switching transients being shifted in phase relative to the first switching transients such that a crosstalk signal resulting from the first and second switching transients has a frequency of twice the first frequency, and filter means associated with the functional switching circuits for attenuating the crosstalk signal.

The means for generating second switching transients preferably comprises a plurality of dummy switching circuits, one corresponding to each of the functional switching circuits, each dummy switching circuit being connected such that its output is a digital inversion of the output of the corresponding functional switching circuit. Typically, each of the functional switching circuits and each of the dummy switching circuits includes a capacitively loaded MOS output stage. Each of the dummy switching circuits includes inverting means so that the output of each dummy switching circuit is opposite in phase from the output of the corresponding functional switching circuit. By generating second switching transients at the same frequency as the first switching transients but shifted in phase, the frequency of the composite crosstalk signal is twice the frequency of the FM signal and can easily be filtered from the outputs of the switching apparatus.

The functional switching circuits and the dummy switching circuits are typically located on an integrated circuit. A capacitive load for each of the dummy switching circuits can be located external to the integrated circuit. In this case, a connector pin is required for each dummy switching circuit. Alternatively, the capacitive load for each of the dummy switching circuits can be located on the integrated circuit. In this case, the capacitive loads are externally connected through a common connector pin of the integrated circuit.

BRIEF DESCRIPTION OF THE DRAWINGS

For a better understanding of the present invention, together with other and further objects, advantages and capabilities thereof, reference is made to the accompanying drawings which are incorporated herein by reference and in which.

DETAILED DESCRIPTION OF THE INVENTION

Figure 1:
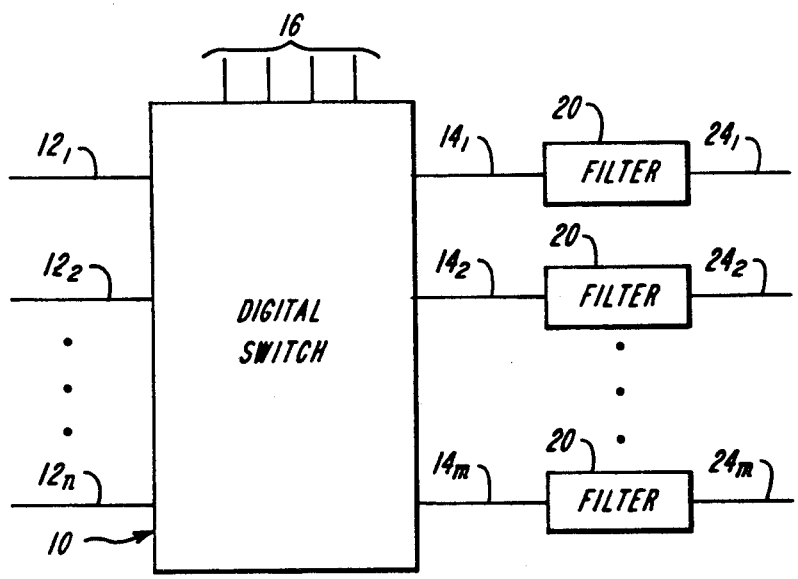
FIG. 1 is a block diagram of digital switching apparatus for switching FM signals.

A block diagram of apparatus for digital switching of FM signals is shown in FIG. 1. An integrated circuit digital switch 10 includes inputs $12_1, 12_2, -12_n$, outputs $13_1, 14_2, -14_m$ and select lines 16. An input signal applied to one of the inputs 12 is switched to one of the outputs 14 under control of select lines 16. The digital switch 10 includes gating circuitry to perform the required switching. The outputs 14 of digital switch 10 are connected through filters 20 to provide filter output $24_1, 24_2, -24_m$.

An example of a digital switch 10 has 64 inputs and 16 outputs. The digital switch is configured as 16 parallel circuit modules, each capable of switching one of the 64 inputs to its output. Each circuit module requires 6 control bits, for a total of 96 (16×16) control bits. The control bits are transferred into the digital switch serially and are stored. The 64 x 16 digital switch is described in more detail by M. Cooperman et. al. in "Broadband Video Switching", *IEEE Communications Magazine*, Vol. 27, No. 12, December 1989, pages 26–30, which is hereby incorporated by reference.

Figure 2:
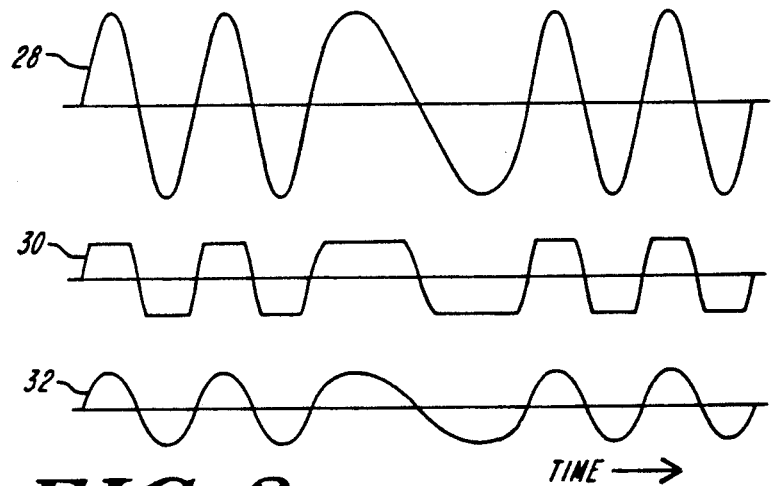
FIG. 2 is a timing diagram which illustrates typical waveforms in the apparatus of FIG. 1.

An example of an analog FM signal 28 is shown in FIG. 2. When the FM signal 28 is applied to input $12_1$ of the digital switch, it is clipped by the cascaded digital stages within digital switch 10. An output signal 30 appearing on output $14_m$ of the digital switch is a square wave voltage having a period which varies in accordance with the FM signal 28. An output signal 32 on filter output $24_m$ is a reproduction of the input FM signal 28.

Figure 3:
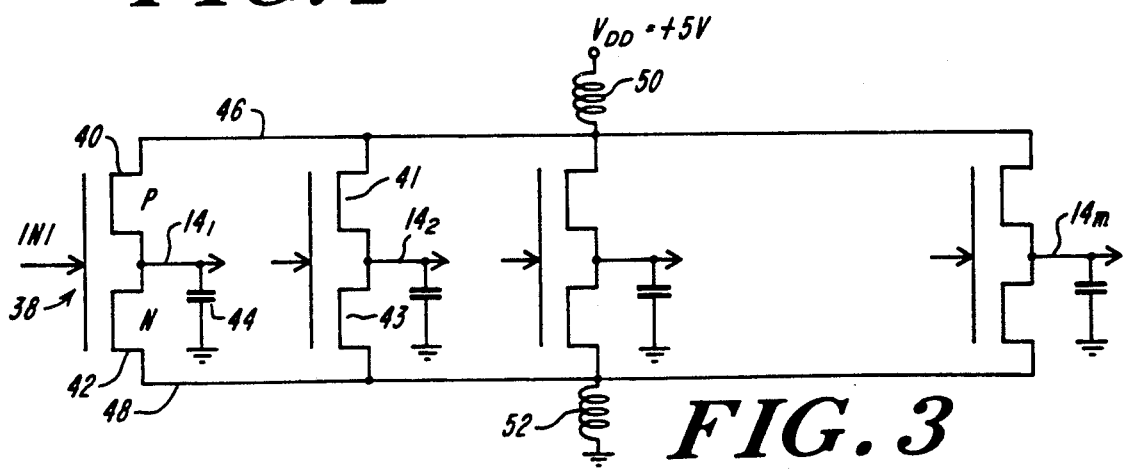
FIG. 3 is a schematic diagram of the output stages of the digital switch.

A schematic diagram of the output stages of the digital switch 10 is shown in FIG. 3. An output stage 38, including a PMOS transistor 40 and an NMOS transistor 42 connected in series, drives a load represented by a capacitor 44. The source of the PMOS transistor 40 is connected to an on chip voltage supply line 46, and the source of the NMOS transistor is connected to an on-chip ground line 48. The drain of transistor 40 and the drain of transistor 42 are connected to output 14. Additional output stages for driving outputs $14_2$—, $14_m$ are connected to supply line 46 and ground line 48. The connection between on chip supply 46 and a positive supply voltage is represented by an inductance 50. The connection between the on-chip ground line 48 and the system ground is represented by an inductance 52. Inductances 50 and 42 represent stray inductance in the connecting lines. The capacitor 44 represents a capacitive load on output $14_1$ of the digital switch 10. Since the capacitor 44 is external to the digital switch chip, it is connected directly to the system ground rather than to the on-chip ground line 48.

When any of the output stages switches, a transient current passes through inductance 50 or inductance 52. The transient current through inductance 50 causes a voltage spike on supply line 46. Similarly, a transient current through inductance 52 causes a voltage spike on ground line 48. These voltage spikes are coupled to all of the circuits on the chip.

Figure 4:
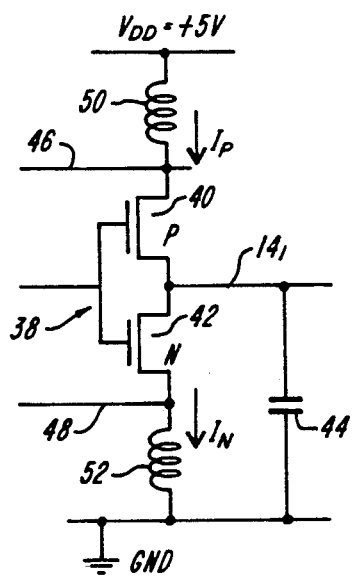
FIG. 4 is a schematic diagram of a single output stage of the digital switch.
Figure 5:
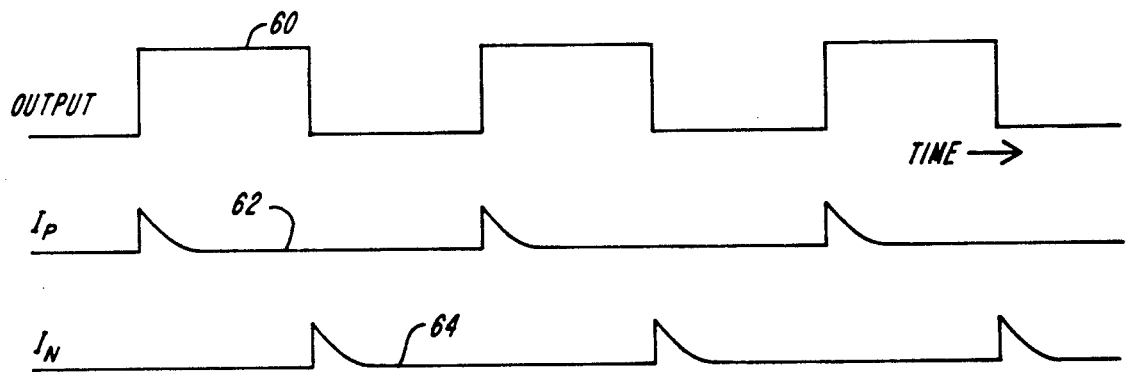
FIG. 5 is a timing diagram which illustrates the generation of crosstalk in the circuit of FIG. 4.

The generation of inductive crosstalk is illustrated in more detail in FIGS. 4 and 5. Output signal 60 shown in FIG. 5 appears on output 14 of the digital output stage 38 shown in FIG. 4. When output 14 switches from 0 volts to +5 volts, transistor 40 is on and transistor 42 is off. A transient current $I_p$ flows through inductance 50 and transistor 40 for charging of capacitor 44. The transient current $I_p$, as illustrated by waveform 62 of FIG. 5, induces a voltage spike across inductance 50. Similarly, when output $14_1$ switches from +5 volts to 0 volts, transistor 40 is off and translator 42 is on. A transient current $I_n$ flows through transistor 42 and inductance 52 for discharging of capacitor 44. The transient current $I_n$, as shown by waveform 64 in FIG. 5, induces a voltage spike across the inductance 52. The transient current $I_p$ produces voltage spikes on the on chip supply line 46. The transient current $I_n$ produces voltage spikes on the on chip ground line 48.

The transient voltages on supply line 46 and ground line 48 produce voltage spikes on the other output stages connected to on chip supply line 46 and on-chip ground line 48. Referring again to FIG. 3, when transistor 41 of the second output stage is on, any voltage spikes on supply line 46 are coupled directly to output $14_2$. Similarly, when transistor 43 of the second output stage is on, any voltage spikes on ground line 48 are coupled directly to output $14_2$. Coupling of voltage spikes occurs in the same way on all output stages of the digital switch.

As discussed above, the switching of transistors 40 and 42 produces crosstalk on other outputs of the digital switch. The magnitude of the crosstalk is directly proportional to the number of outputs that are switching simultaneously. In a digital switch having 64 inputs and 16 outputs, the inductive crosstalk per switched output is about 100 millivolts, thereby resulting in a total crosstalk of 1.5 volts for 15 simultaneously switched outputs.

With reference to FIG. 5, it is seen that transient current $I_p$ and transient current $I_n$ each have a fundamental frequency that is the same as the fundamental frequency of output signal 60. Since the crosstalk and the signals have the same fundamental frequency, the transients can not be filtered.

Figure 6:
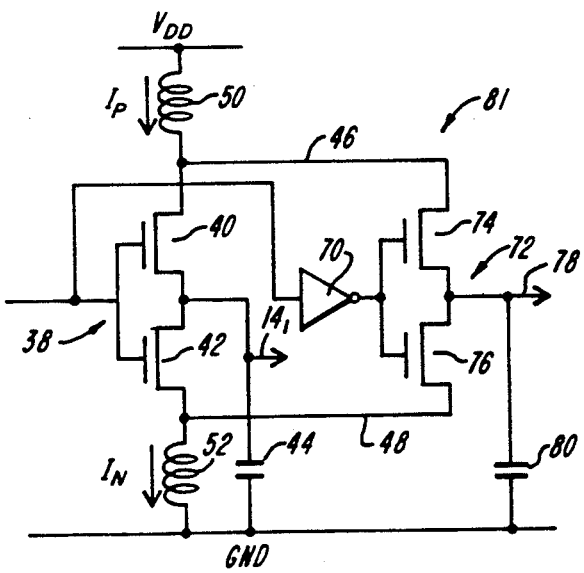
FIG. 6 is a schematic diagram of a functional output stage and a dummy switching circuit in accordance with the present invention.
Figure 7:
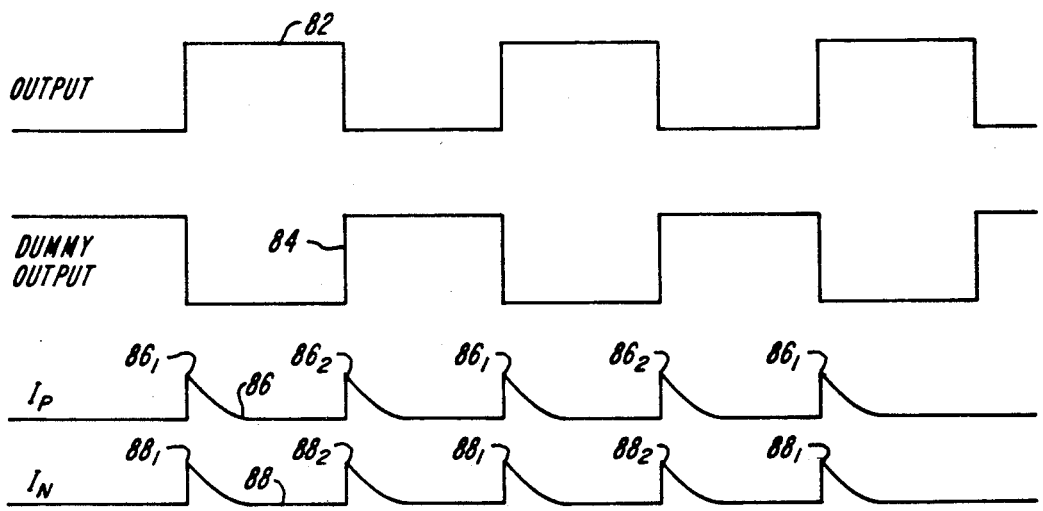
FIG. 7 is a timing diagram which illustrates the generation of crosstalk in the circuit of FIG. 6.

A circuit in accordance with the present invention is shown in FIG. 6. Corresponding waveforms are shown in FIG. 7. The output stage 38, including transistors 40 and 42 connected to output $14_1$, is the same as the output stage 38 shown in FIG. 4 and described hereinabove. The input signal to transistors 40 and 42 is connected to the input of a digital inverter 70. The output of inverter 70 is connected to the input of a dummy output stage 72, including a PMOS transistor 74 and an NMOS transistor 76 connected in series between on-chip supply line 46 and on chip ground line 48. The output of inverter 70 is connected to the gates of transistors 74 and 76. The source of transistor 74 is connected to on chip supply line 46, and the source of transistor 76 is connected to on chip ground line 48. The drain of transistor 74 and the drain of transistor 76 are connected to a dummy output 78. A capacitor 80, typically located external to the chip, is connected between dummy output 78 and the system ground. Preferably, transistors 40 and 74 are identical or nearly identical, and transistors 42 and 76 are identical or nearly identical so that the dummy output stage 72 operates in the same manner as the output stage 38 of the digital switch 10. Preferably, the capacitors 44 and 80 are equal or nearly equal in value.

The inverter 70 and the dummy output stage 72 constitute a dummy switching circuit 81 which provides a nonfunctional dummy output. By contrast, the output stage 38 is a functional part of the digital switch 10. A dummy switching circuit is provided for each output stage of the digital switch. Thus, each output stage has a corresponding dummy switching circuit for reducing crosstalk as described below.

The purpose of the dummy switching circuit 81 is to produce transients which are substantially identical to the transients produced by the output stage 38, but displaced in time. Referring to FIG. 7, waveform 82 represents an output signal on output $14_1$ of the output stage 38, and waveform 84 represents the corresponding signal on dummy output 78. Waveforms 82 and 84 are inverted, or out of phase, relative to each other. The transients generated by output stage 38 and dummy switching circuit 81 add, thereby producing the waveforms 86 and 88 shown in FIG. 7.

Waveform 86 represents the transient current $I_p$ through inductance 50, and waveform 88 represents the transient current $I_n$ through inductance 52. Transients $86_1$ of current $I_p$ are produced by the positive going edges of waveform 82 on output $14_1$, when transistor 40 turns on and charges capacitor 44 through inductance 50. Transients $86_2$ of current $I_p$ are produced by the positive going edges of waveform 84 on dummy output 78, when transistor 74 turns on and charges capacitor 80 through inductance 50. Since the currents for transistors 40 and 74 are both drawn through inductance 50, the transients add and produce waveform 86. Transients $88_1$ of current $I_n$ are produced by the negative going edges of waveform 84 on dummy output 78, when transistor 76 turns on and discharges capacitor 80 through inductance 52. Similarly, transients $88_2$ of current $I_n$ are produced by the negative going edges of waveform 82 on output $14_1$, when transistor 42 turns on and discharges capacitor 44 through inductance 52. Since the currents for transistors 42 and 76 both pass through inductance 52, the transients add and produce waveform 88.

The fundamental frequency component of transient currents $I_p$ and $I_n$ is twice the fundamental frequency of the output signal 82. Thus, the lowest frequency component of the crosstalk resulting from transient currents $I_p$ and $I_n$ is twice the frequency of the FM signal. As a result, the crosstalk can be removed with a bandpass filter which allows the desired FM signal of frequency $f \pm \Delta f$ to pass, where f is the carrier frequency and $\Delta f$ is the frequency deviation. The frequency components of the crosstalk are $2f \pm 2\Delta f$ or higher and are attenuated by the bandpass filter.

For maximum effectiveness of the invention, all FM input signals to the digital switch 10 should have approximately the same carrier frequency. In normal practice, this requirement is met. The crosstalk which appears in the outputs of digital switch 10 at twice the FM carrier frequency can be filtered by filters 20 as shown in FIG. 1. In addition, the digital switch typically has a frequency response which will attenuate crosstalk at twice the FM signal frequency. This filtering results from the inherent frequency response of the digital switch. In general, filtering of crosstalk at twice the FM signal frequency can be performed at any convenient location in the apparatus.

For optimum crosstalk reduction, output $14_1$ and dummy output 78 should make transitions at the same time. This can be achieved by building delay into output stage 38 to compensate for the delay produced by inverter 70. The delay can be achieved by a small resistor-capacitor circuit at the input to transistors 40 and 42. In practice, the FM signal passes through many digital stages in digital switch 10 before reaching output $14_1$ so that the required delay can be inserted at any convenient location in the circuit after the connection of the inverter 70. As indicated above, the value of capacitor 80 should be equal to the capacitor 44. In cases where capacitor 44 is the stub of a transmission line, the value of capacitor 80 is made to approximate the effective capacitance of the transmission line stub.

In the above described technique for reducing crosstalk, a dummy switching circuit 81, including inverter 70 and dummy output stage 72, is provided for each output stage of the digital switch 10. Thus, a dummy switching circuit corresponds to each functional output circuit of the digital switch 10. In the configuration shown in FIG. 6, each dummy output is connected to a capacitor which is located external to the integrated circuit. This configuration requires one additional connector pin for each output of the digital switch 10, thereby increasing the number of connector pins by 16 for a 16 output switch.

Figure 8:
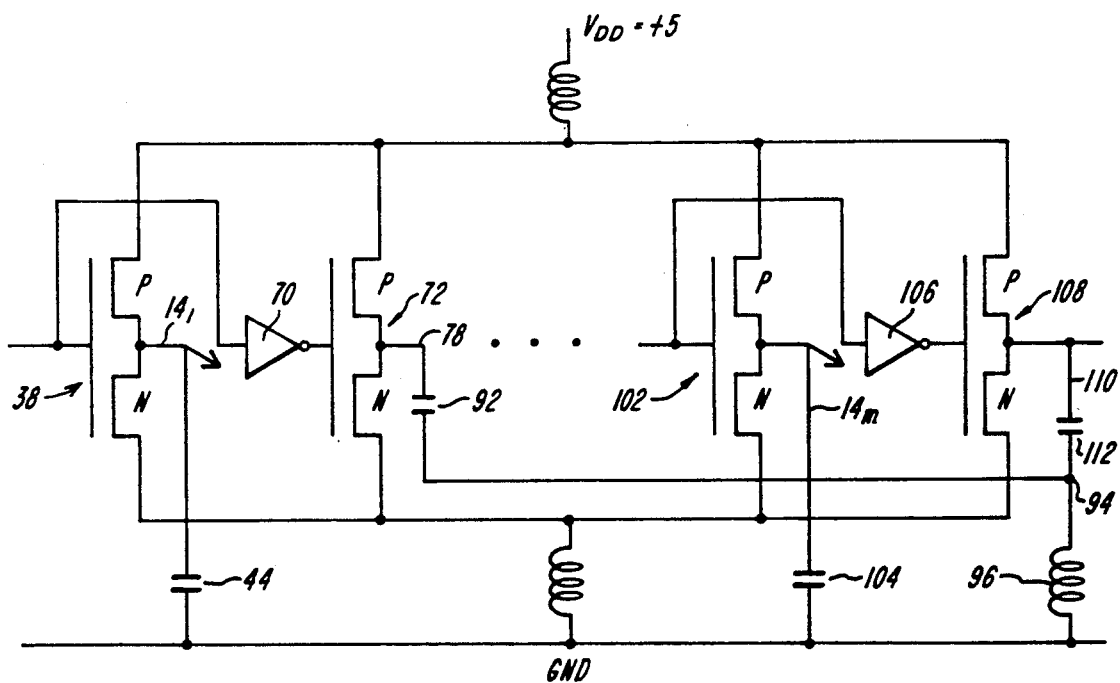
FIG. 8 is a schematic diagram of a digital switch including dummy switching circuits which require only one additional connector pin.

A configuration which requires only one additional connector pin, regardless of the number of outputs, is shown in FIG. 8. Output stage 38 of the digital switch 10 has output $14_1$ connected to external capacitor 44 as shown in FIG. 6. Output 78 of dummy output stage 72 is connected through an on chip capacitor 92 to a connector pin 94. The connector pin 94 is externally connected to the system ground by a connection through inductance 96. Inductance 96 represents stray inductance in the connecting line. Another output stage 102 of the digital switch 10 has output $14_m$ connected to an external capacitor 104. The input of stage 102 is connected through an inverter 106 to a dummy output stage 108. The dummy output stage 108 has a dummy output 110 connected through an on-chip capacitor 112 to connector pin 94. The circuit including output stage 102, inverter 106 and dummy output stage 108 is the same as the circuit including output stage 38, inverter 70 and dummy output stage 72. This combination of circuits is repeated for each output of the digital switch 10. Each dummy output is connected through a separate on-chip capacitor to connector pin 94. For optimum crosstalk reduction, each of the on-chip capacitors 92, 112, etc. should be equal to the average equivalent capacitance of the output loads. In the configuration of FIG. 8, only one additional connector pin 94 is required to implement the crosstalk reduction scheme for a multiple output digital switch 10.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Digital switching apparatus comprising:
    a plurality of digital switching circuits, each having an input for receiving an FM signal at a first frequency and each generating first switching transients in response to said FM signal;
    means for generating second switching transients in response to said FM signal, said second switching transients being shifted in phase relative to said first switching transients such that a crosstalk signal resulting from said first and second switching transients has a frequency of twice the first frequency; and
    filter means associated with said digital switching circuits for attenuating said crosstalk signal.

2. Digital switching apparatus as defined in claim 1 wherein said means for generating second switching transients comprises a plurality of dummy switching circuits, one corresponding to each of said functional switching circuits, each dummy switching circuit being connected such that its output is a digital inversion of the output of the corresponding functional switching circuit.

3. Digital switching apparatus as defined in claim 2 each of said functional switching circuits and each of said dummy switching circuits includes a capacitively loaded MOS output stage.

4. Digital switching apparatus as defined in claim 3 wherein each of said dummy switching circuits includes inverting means such that the output of each dummy switching circuit is opposite in phase from the output of the corresponding functional switching circuit.

5. Digital switching apparatus as defined in claim 3 wherein said functional switching circuits and said dummy switching circuits are located on an integrated circuit.

6. Digital switching apparatus as defined in claim 5 wherein each of said dummy switching circuits is connected to a capacitive load that is external to said integrated circuit.

7. Digital switching apparatus as defined in claim 6 wherein the capacitive load for each of said dummy switching circuits is located external to said integrated circuit.

8. Digital switching apparatus as defined in claim 5 wherein the capacitive load for each of said dummy switching circuits is externally connected through a common connector pin of said integrated circuit.

9. Digital switching apparatus as defined in claim 1 wherein said filter means comprises an inherent frequency response of each of said functional switching circuits.

10. Digital switching apparatus as defined in claim wherein said filter means has a frequency response that passes said first frequency and attenuates the crosstalk signal at a frequency of twice the first frequency.

11. A method for reducing crosstalk in apparatus for digital switching of FM signals, said apparatus comprising a plurality of digital switching circuits, each having an input for receiving an FM signal at a first frequency and each generating first switching transients in response to said FM signal, said method comprising the steps of:

generating second switching transients that are shifted in phase relative to said first switching transients such that a crosstalk signal resulting from first and second switching transients has a frequency of twice the first frequency; and attenuating the crosstalk signal from the outputs of the functional switching circuits.

12. A method as defined in claim 11 wherein the step of generating second switching transients includes providing a dummy switching circuit corresponding to each of the functional switching circuits and connecting each dummy switching circuit such that its output is a digital inversion of the output of the corresponding functional switching circuit.

13. A method as defined in claim 12 wherein the step of generating second switching transients further includes connecting to the output of each dummy switching circuit a load that is substantially equal to the load on the corresponding functional switching circuit.

14. A method as defined in claim 13 wherein the step of generating second switching transients includes providing the functional switching circuits, the dummy switching circuits and the loads for the dummy switching circuits on an integrated circuit and connecting the loads for the dummy switching circuits through a single connector pin of the integrated circuit.

* * * * *